(12) United States Patent
Ohashi

(10) Patent No.: US 6,296,504 B1
(45) Date of Patent: Oct. 2, 2001

(54) SOCKET FOR ELECTRICAL PARTS

(75) Inventor: Yoshiyuki Ohashi, Kawaguchi (JP)

(73) Assignee: Enples Corporation, Kawaguchi (JP)

( * ) Notice: Subject to any disclaimer, the term of this patent is extended or adjusted under 35 U.S.C. 154(b) by 0 days.

(21) Appl. No.: 09/627,094

(22) Filed: Jul. 27, 2000

(30) Foreign Application Priority Data

Jul. 30, 1999 (JP) ................................. 11-216286

(51) Int. Cl.⁷ .................................................. H01R 13/62
(52) U.S. Cl. ........................................... 439/266; 439/331
(58) Field of Search .................................... 439/330, 331, 439/525, 526, 266, 267, 268, 261, 341, 342, 263–265

(56) References Cited

U.S. PATENT DOCUMENTS 5,989,039 * 11/1999 Sik .......................................... 439/331
6,106,319 * 8/2000 Fukunaga et al. ..................... 439/342

* cited by examiner

Primary Examiner—Renee Luebke
Assistant Examiner—Felix O. Figueroa
(74) Attorney, Agent, or Firm—Staas & Halsey LLP

(57) ABSTRACT

A socket for an electrical part, the socket having a socket body with a surface and a mount portion in which an electrical part having a plurality of terminals is mounted, a plurality of contact pins mounted on the socket body that are elastically contacted to or separated from the plurality of terminals of the electrical part, the plurality of contact pins having an elastic piece formed at a front end, with a contact portion, a single slide plate slidably connected on a surface of the socket body and an operation member that is vertically movable with respect to the surface of the socket body, wherein either the operation member or the slide plate is formed with an inclined surface and the other of the operation member and the slide plate is formed with a movement roller member which rolls on the inclined surface portion such that when the operation member is moved in a direction normal to the surface of the socket body, the roller member rolls on the inclined surface portion to thereby slide the slide plate in one direction against an elastic force of the plurality of contact pins.

15 Claims, 10 Drawing Sheets

FIG.4A
FIG.4B
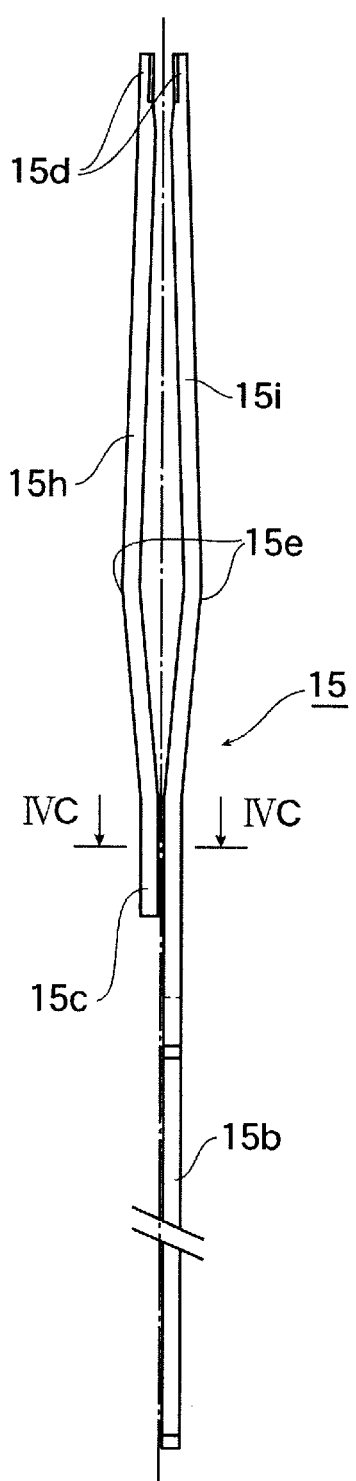
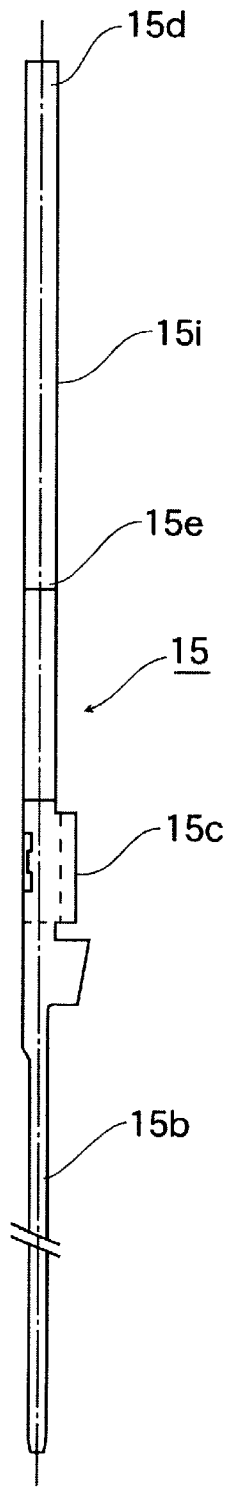
FIG.4C
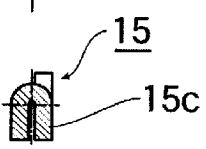

SOCKET FOR ELECTRICAL PARTS

BACKGROUND OF THE INVENTION

The present invention relates to a socket for electrical parts that temporarily holds an electrical part, such as semiconductor device (called hereunder "integrated circuit package"). The improvement is in the moving mechanism for the slide plate that displaces contact portions of a contact pin that clamps a terminal of the electrical part.

There is a known integrated circuit socket, that detachably holds an integrated circuit package as "electrical part". The known IC package includes a BGA (Ball Grid Array) type in which a number of solder balls as terminals are attached to a lower surface of a rectangular package body.

A plurality of contact pins are arranged in the integrated circuit socket, and each of the contact pins has a pair of elastic pieces having ends on which contact portions are formed. The contact portions thereby clamp the side surface of the solder ball attached to the lower surface of the rectangular package body. The clamping happens when one of the paired elastic pieces is elastically deformed by being pushed by a slide plate which slides in a horizontal direction.

Further, the integrated circuit socket comprises a socket body, and an operation member is disposed to be vertically movable with respect to the socket body. When the operation member is moved downward, the slide plate is displaced by a link mechanism and one of the elastic pieces of the contact pins is elastically deformed to thereby widen a distance between the contact portions. The solder ball is inserted in the space in the contact pins. Thereafter, the slide plate returns to its original position and, hence, the one of the elastic pieces is also returned to its original position before the deformation, thus clamping the solder ball between both the contact portions. An electrical connection is thereby established.

A performance test, such as a burn-in, carried out. The slide plate is then slid in the manner mentioned above, such that the contact portion of one of the elastic pieces is again deformed. The wider distance between the contact portions allows separation from the solder ball. Thereafter, the integrated circuit package is taken out from the integrated circuit socket by an automatic machine. According to the structure mentioned above, the integrated circuit package can be mounted or dismounted using little force. Thus the working efficiency can be improved.

In such a conventional structure however, because the vertical motion of the operation member is converted to the horizontal motion of the slide plate through the link mechanism, it is required to use a plurality of link members. The additional pieces increases the number of parts and makes the entire structure of the integrated circuit socket large in order to provide a space for the link members, each having a relatively long length.

SUMMARY OF THE INVENTION

An object of the present invention is to substantially eliminate defects or drawbacks encountered in the prior art mentioned above and to provide a socket for electrical parts having a compact structure with reduced number of members or parts.

This and other objects can be achieved according to the present invention by providing, in one aspect, a socket for an electrical part comprising:

a socket body provided with a mount portion on which an electrical part having a terminal is mounted;

a contact pin provided for the socket body so as to be contacted to or separated from the terminal of the electrical part, the contact pin having an elastic piece formed, at an front end portion thereof, with a contact portion;

a slide plate disposed for the socket body to be slidable on a surface of the socket body; and an operation member provided for the socket body to be vertically movable with respect to the surface of the socket body, the contact portion being displaced in accordance with an elastical deformation of the elastic piece so as to be contacted to or separated from the terminal of the electrical part, wherein either one of the operation member and the slide plate is formed with an inclined surface portion and another one thereof is formed with a roller member for movement rolling on the inclined surface portion so that when the operation member is moved in a direction normal to the surface of the socket body, the roller member rolls on the inclined surface portion to thereby slide the slide plate.

In a preferred embodiment, there is also provided with a reaction receiving means for receiving a reaction force applied from the slide plate to the operation member at a time when the slide plate is moved, the reacting receiving means being disposed between the slide plate and the socket body. The reaction receiving means comprises a roller member, for reaction, provided for either one of the operation member and the socket body and a rolling wall section, on which the reaction roller member rolls, formed to another one thereof so that the reaction force acting on the operation member at a time of moving the slide plate is received by the socket body through the reaction roller member and the rolling wall section.

The socket body is formed with a guide wall section with an interval from the rolling wall section between which the reaction roller member is inserted to thereby constitute a guide means for moving the operation member.

The inclined surface portion is formed on the slide plate. The movement roller member and the reaction roller member are mounted on a common axis and the rolling wall section is formed on the socket body.

The socket body has a rectangular outer shape, the slide plate is disposed to be slidable on a substantially diagonal line of the rectangular shape, and the roller member for movement and the inclined surface portion are disposed on the diagonal line.

Further, the operation member is provided with a pair of support posts 19C which are located to support the roller member 19D. A support shaft is located between the pair of support posts, a roller member is mounted in the central portion of the support shaft, and reaction roller members are mounted at both side portions of the movement roller member on the support shaft.

According to the present invention because a link mechanism as in a conventional structure is not needed, the number of parts or members can be reduced and the entire structure of the socket can be made smaller. Moreover, by using the roller member for movement, the inclined surface portion of the slide plate is more durable and longer lasting.

Furthermore, since the reaction force acting on the operation member at the time of moving the slide plate is received by the reaction receiving member, the operation member is not moved in a direction parallel to the upper surface of the socket body. The sliding operation of the slide plate can be performed with high accuracy. Further, since the reaction force is received by the socket body through the reaction roller and the rolling wall, thereby reducing wearing of the rolling wall section and extending its lifetime.

Since the reaction roller can be inserted between the rolling wall section and the guide wall section, the operation member is moved under the guidance thereof. Hence, the operation member can smoothly move vertically with respect to the upper surface of the socket body.

Furthermore, since the inclined surface portion is formed on the slide plate, and the movement roller member and the reaction roller member are mounted on a common axial member, and the rolling wall section is formed to the socket body, the socket can be made compact. The reaction force applied from the inclined surface portion to the movement roller is received by the rolling wall section through the reaction roller members disposed adjacent to the movement roller on the common shaft member. Therefore, since the portion on which the reaction force is applied and the portion at which the reaction force is received are not far apart an unnecessary external force is not applied to the operation member. Thus the operation member moves smoothly.

Still furthermore, by arranging the slide plate to be slidable along the diagonal line of the rectangular shape of the socket, the entire structure thereof can be made compact in comparison with a conventional structure in which a link mechanism is disposed in parallel to the diagonal line. Moreover, the arrangement using the movement roller member and the inclined surface portion to slide the slide plate can effectively makes compact the entire structure of the socket.

In a modified aspect of the present invention, there is provided a socket for an electrical part comprising:

a socket body provided with a mount portion on which an electrical part having a terminal is mounted;

a contact pin provided for the socket body so as to be contacted to or separated from the terminal of the electrical part, the contact pin having an elastic piece formed, at an front end portion thereof, with a contact portion, which is displaced in accordance with an elastical deformation of the elastic piece;

a slide plate disposed for the socket body to be slidable on a surface of the socket body;

an operation member provided for the socket body to be vertically movable with respect to the surface of the socket body; and a reaction receiving means disposed between the slide plate and the socket body for receiving a reaction force applied from the slide plate to the operation member at a time when the slide plate is moved, the reaction receiving means comprising a roller member, for reaction, provided for either one of the operation member and the socket body and a rolling wall section, on which the reaction roller member rolls, formed to another one thereof so that the reaction force acting on the operation member at a time of moving the slide plate is received by the socket body through the reaction roller member and the rolling wall section.

In this embodiment, one of the operation member and the slide plate is formed with an inclined surface portion and the other one is formed with a roller member for movement rolling on the inclined surface portion so that when the operation member is moved in a direction normal to the surface of the socket body, the roller member rolls on the inclined surface portion to thereby slide the slide plate.

The nature and further characteristic features can be made clear from the following descriptions made with reference to the accompanying drawings.

BRIEF DESCRIPTION OF THE DRAWINGS

In the accompanying drawings:

FIG. 4 shows a structure of a contact pin of the integrated circuit socket and includes FIG. 4A being a front view of the contact pin, FIG. 4B right side view of FIG. 4A and FIG. 4C being a sectional view taken along the line IVC—IVC in FIG. 4A;

DESCRIPTION OF THE PREFERRED EMBODIMENT

Figure 1:
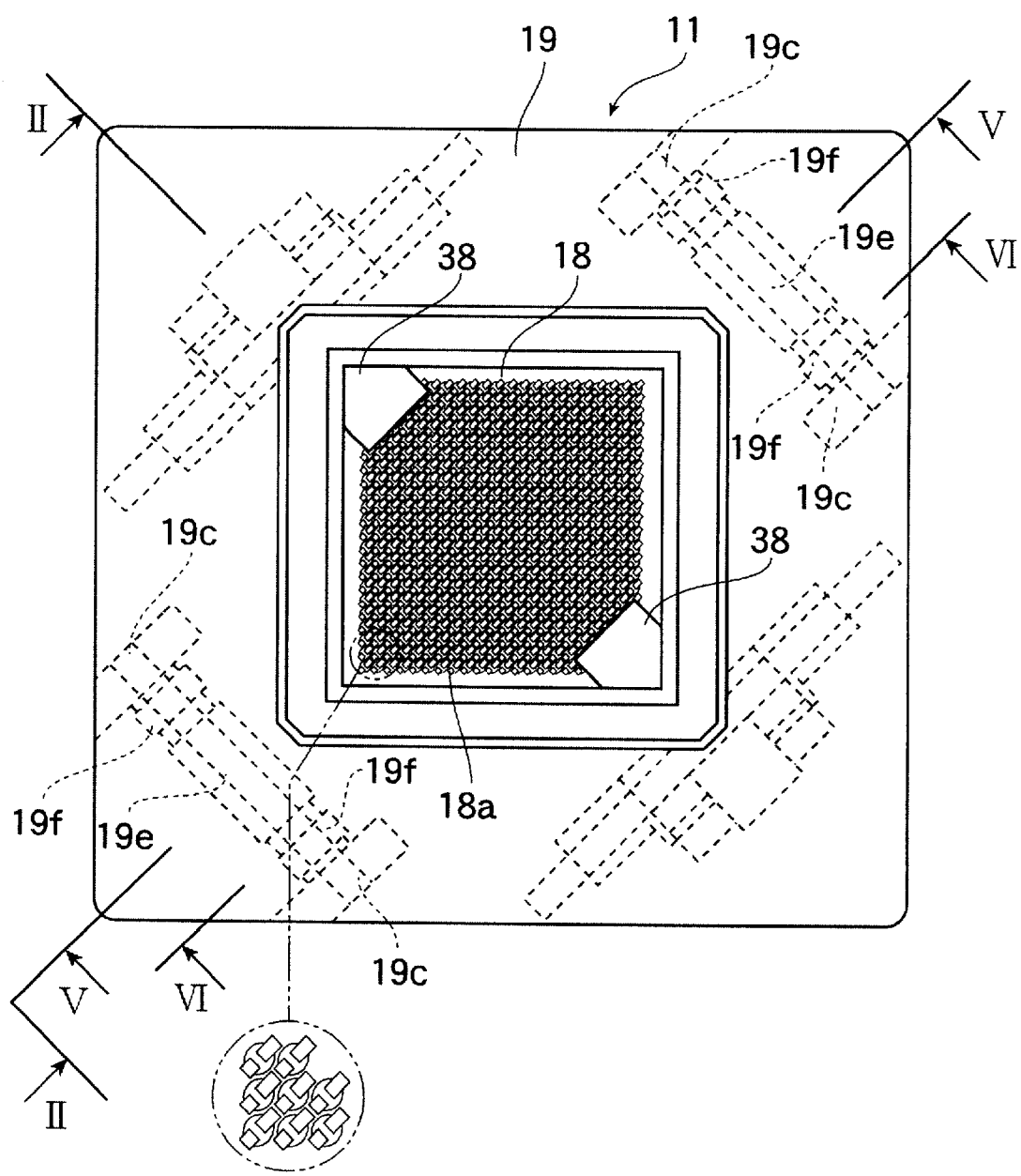
FIG. 1 is a plan view of an integrated circuit socket according to one embodiment of the present invention.

The present invention will be described hereunder by way of a preferred embodiment with reference to the accompanying drawings.

Reference numeral 11 denotes an integrated circuit socket as a "socket for an electrical part", and the IC socket 11 is a member for realizing an electrical connection between a solder ball 12b as a "terminal" which is part of integrated circuit package 12 as an "electrical part" and a printed circuit board, not shown. A measuring device such as tester can then carry out a performance test of the integrated circuit package 12.

Figure 3A:
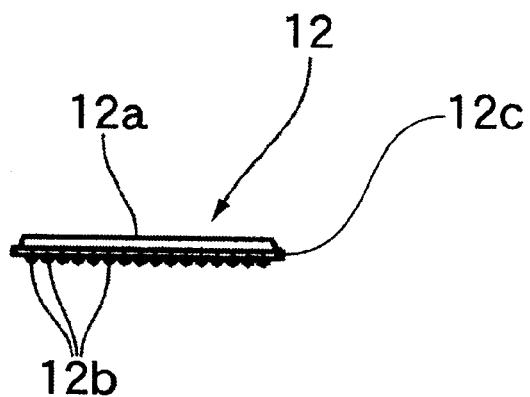
FIG. 3 shows an integrated circuit package according to the embodiment of FIG. 1 and includes FIG. 3A being a front view and FIG. 3B being a bottom view.
Figure 3B:
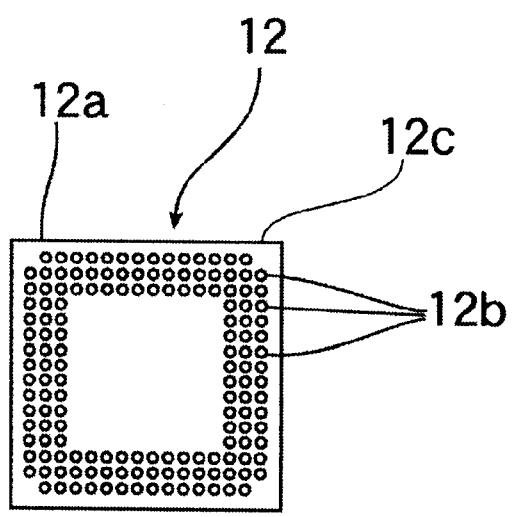

The integrated circuit package 12 has a ball grid array type structure as shown in FIGS. 3 (3A, 3B), in which the integrated circuit package 12 includes a package body 12a, for example, having a rectangular shape, and a number of solder balls 12b, each having a spherical shape, are arranged in matrix so as to project downward from a lower surface of the package body 12a.

Figure 2:
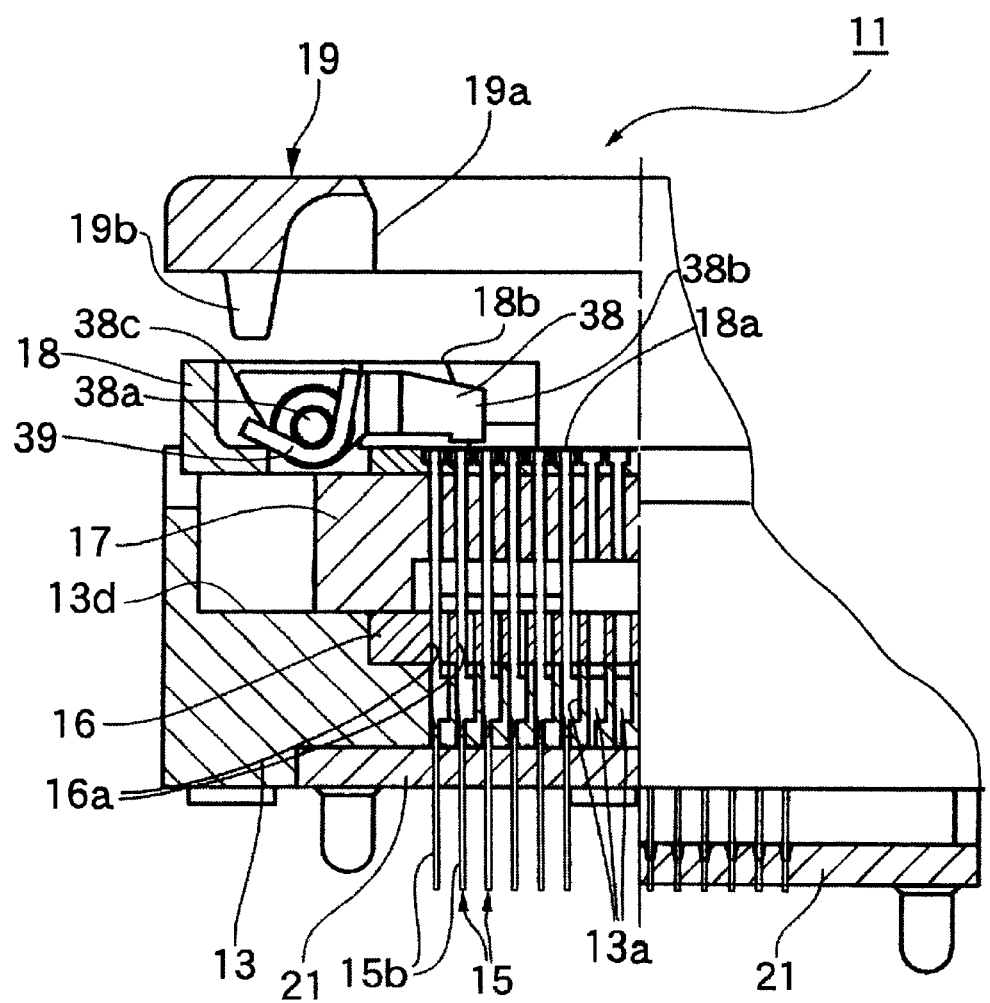
FIG. 2 is a sectional view taken along the line II—II in FIG. 1.

On the other hand, as shown in FIG. 2, for example, the integrated circuit socket 11 is generally provided with a socket body 13 mounted to a printed circuit. board, not shown, and a number of contact pins 15 contacting to or separating from the solder balls 12b, respectively, are provided for the socket body 13. Furthermore, a preload plate 16, a slide plate 17 and a top plate 18 are disposed above the upper portion of the socket body 13 in a manner laminated in this order, and an operation member 19 for slidably moving the slide plate 17 is further disposed above the top plate 18.

Each of the contact pins 15 has a springy property and is formed from a conductive plate member through a pressing working so as to provide a shape shown in FIG. 4.

In FIG. 4, for example, the contact pin 15 comprises a pair of elastic pieces including a stationary side elastic piece 15h and a movable side elastic piece 15i and a solder tail portion 15b disposed to the lower side of the elastic pieces. The paired elastic pieces 15h and 15i are integrated at their base portion 15c, which is bent in substantially U-shape so that the respective elastic pieces 15h and 15i oppose each other. As mentioned above, both the elastic pieces 15h and 15i extend upward from the base portion 15c and have upper end portions formed as a pair of contact portions 15d which are contacted to or separated from the side surface of the solder ball 12b of the integrated circuit package 12 and between which the solder ball 12b is clamped and held.

The solder tail portion 15b and the base portion 15c are press-fitted into a fitting hole 13a formed to the socket body 13 as shown in FIG. 1. The solder tail portion 15b projecting downward over the socket body 13 further extends downward through a location board 21 and then is inserted into an insertion hole formed to the printed circuit board. All the contact pins 15 are arranged in the manner mentioned above.

Figure 10A:
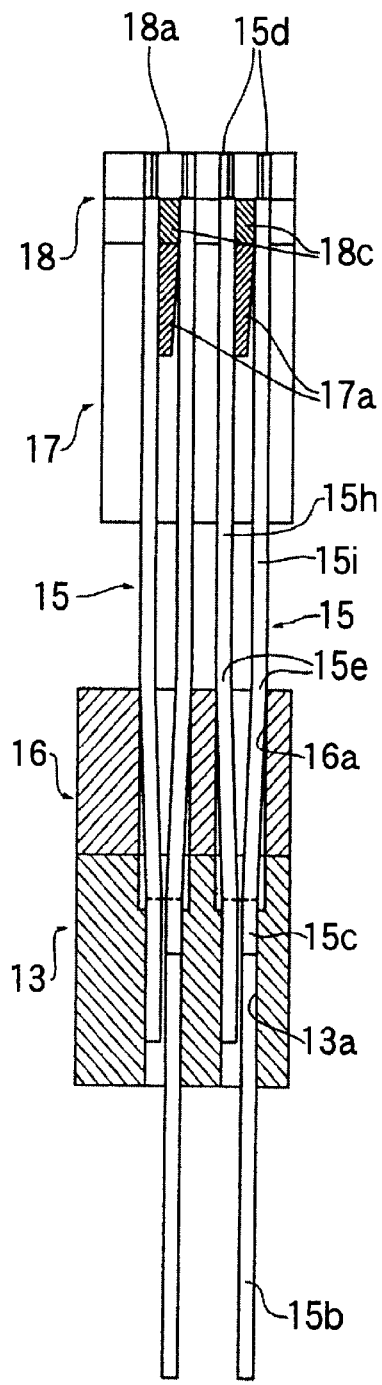
FIG. 10 shows an operating condition of the integrated circuit socket according to the present invention and includes FIG. 10A showing a state that a pair of contact portions of the contact pin are closed, FIG. 10B showing a state that the paired contact portions are opened, and FIG. 10C being a sectional view showing a state that a solder ball is clamped between the paired contact portions.
Figure 10B:
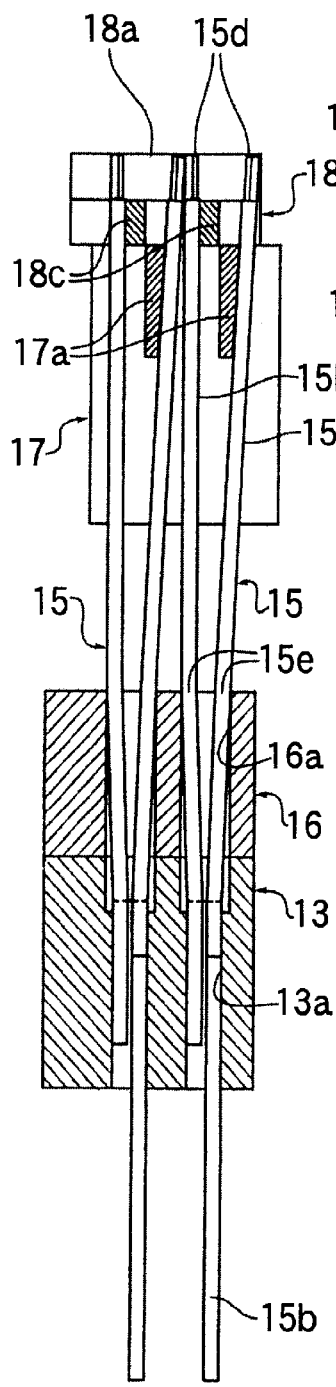

The preload plate 16 is mounted to be detachable to the socket body 13 in a fashion as shown in FIGS. 10 (10A, 10B, 10C). The preload plate 16 is formed with preload holes 16a into which the elastic pieces 15h and 15i of the contact pins 15 are inserted. The diameter of the preload hole 16a is set so that, under the elastic pieces 15h and 15i being inserted into the preload holes 16a, the elastic pieces 15h and 15i are pressed so as to elastically deform the elastic pieces in a direction along which the contact portions 15d are closed.

In this operation, the elastic pieces 15h and 15i of this embodiment are formed with bent portions 15e, respectively. Top portions of the bent portions 15e are pressed by inner wall section of the preload hole 16a when inserted thereinto.

Incidentally, the slide plate 17 is slidable in a direction parallel to the upper surface 13d of the socket body 13 and in substantially a diagonal direction of a rectangular outer shape of the integrated circuit socket 11. When the slide plate 17 is slid, the movable side elastic piece 15i of the contact pin 15 is elastically deformed to thereby displace the contact portions 15d by a predetermined.

This slide plate 17 is slid, by a mechanism which will be mentioned later, through the vertical motion of the operation member 19 in a direction perpendicular to the upper surface 13d of the socket body 13. Further, the slide plate 17 is formed with a pressing portion 17a adapted to press and elastically deform the movable side elastic piece 15i.

The top plate 18 is formed with a mount portion 18a on which the integrated circuit package 12 is mounted and a guide portion 18b disposed at a portion corresponding to the peripheral edge portion of the package body 12a and adapted to position the integrated circuit package 12 to the predetermined position.

Furthermore, as shown in FIG. 10A, for example, the top plate 18 is formed with positioning portions 18c each being inserted between the paired contact portions 15d of each of the contact pins 15, and the positioning portion 18c is clamped between both the elastic pieces 15h and 15i of the contact pin 15 in a state that no external force is applied to both the elastic pieces 15h and 15i, i.e. that both the contact portions 15d are closed.

Furthermore, the operation member 19 has an opening 19a off size capable of the integrated circuit package 12 being inserted, as shown in FIGS. 1 and 2. The integrated circuit package 12 is inserted through this opening 19a and then mounted on the predetermined position of the mount portion 18a of the top plate 18. The operation member 19 is vertically movable with respect to the socket body 13 and urged vertically by a spring means, not shown, and the operation member 19 is also formed with operation protrusions 19b for rotating latches 38.

The latches 38 are, as shown in FIG. 1, disposed at portions on a diagonal line of the outer shape of the integrated circuit socket 11, and as shown in FIG. 2, attached to the socket body 13 so as to be rotatable about shafts or pins 38a. The latch 38 is urged by the spring 39 in a central direction of the socket body 13 and is also formed, at its front end, with a pressing portion 38b so as to press a peripheral corner portion 12c of the integrated circuit package body 12a.

The latch 38 is also formed with a press portion 38c to be pressed by the operation protrusion 19b of the operation member 19, and when the operation member 19 is lowered, the press portion 38c is depressed by the operation protrusion 19b, and the latch 38 is rotated outward of the socket body 13 in FIG. 2 so that the pressing portion 38b is retired from the disposing position of the integrated circuit package 12.

Figure 7:
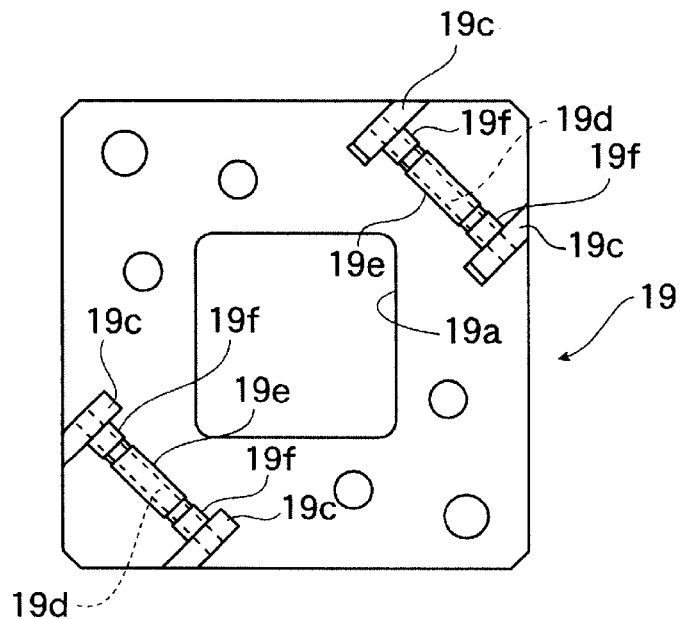
FIG. 7 shows an operation member of the integrated circuit socket viewed from a back side thereof.

A mechanism for slidably moving the slide plate 17 is located between the operation member 19 and the slide plate 17. That is, a pair of support posts 19c are provided at portions on the diagonal line of the lower surface of the operation member 19 as shown in FIG. 7, and a support shaft 19d is disposed between each of the paired support posts 19c. A roller 19e for movement is mounted to a central portion of each of the support shaft 19d and reaction rollers 19f are mounted to both end portions of the support shaft 19d on both side portions of the central roller 19e. The rollers 19e and 19f are mounted to be independently rotatable.

Figure 8:
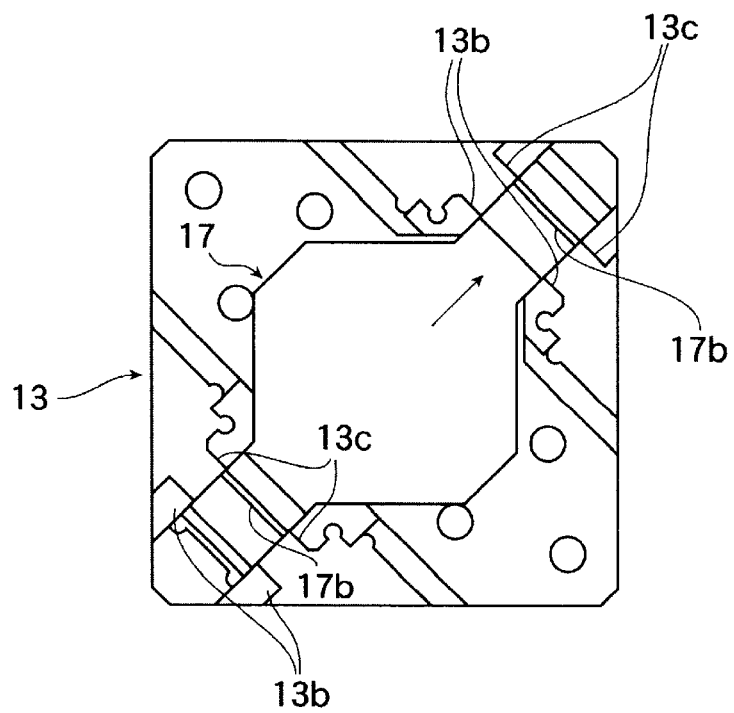
FIG. 8 is a schematic plan view showing a state that a slide plate is mounted to a socket body of the integrated circuit socket of the embodiment shown in FIG. 1.
Figure 9A:
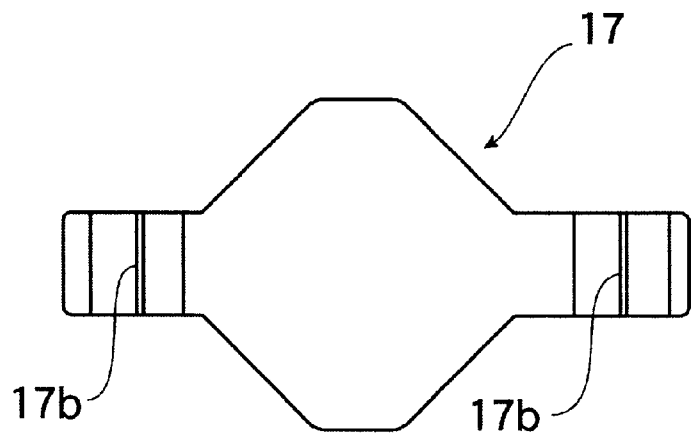
FIG. 9 shows the slide plate and includes FIG. 9A being a schematic plan view of the slide plate and FIG. 9B being a schematic front view thereof.
Figure 9B:
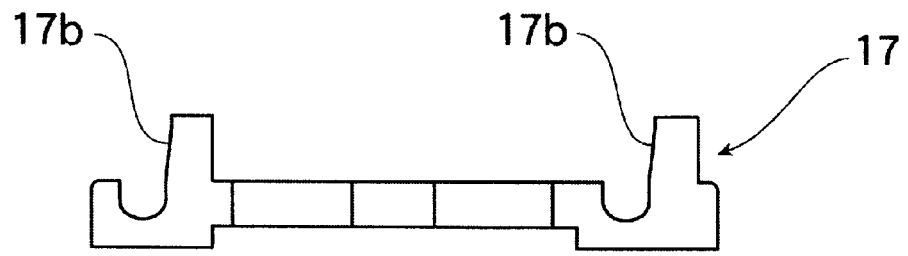

As shown in FIGS. 9A and 9H, the slide plate 17 is formed with an inclined surface portion 17b on which the roller 19e for movement rolls. When the operation member 19 is lowered and the roller 19e thereof rolls on the inclined surface portion 17b, the slide plate 17 is slid in the direction arrowed in FIGS. 5 and 8.

Figure 6:
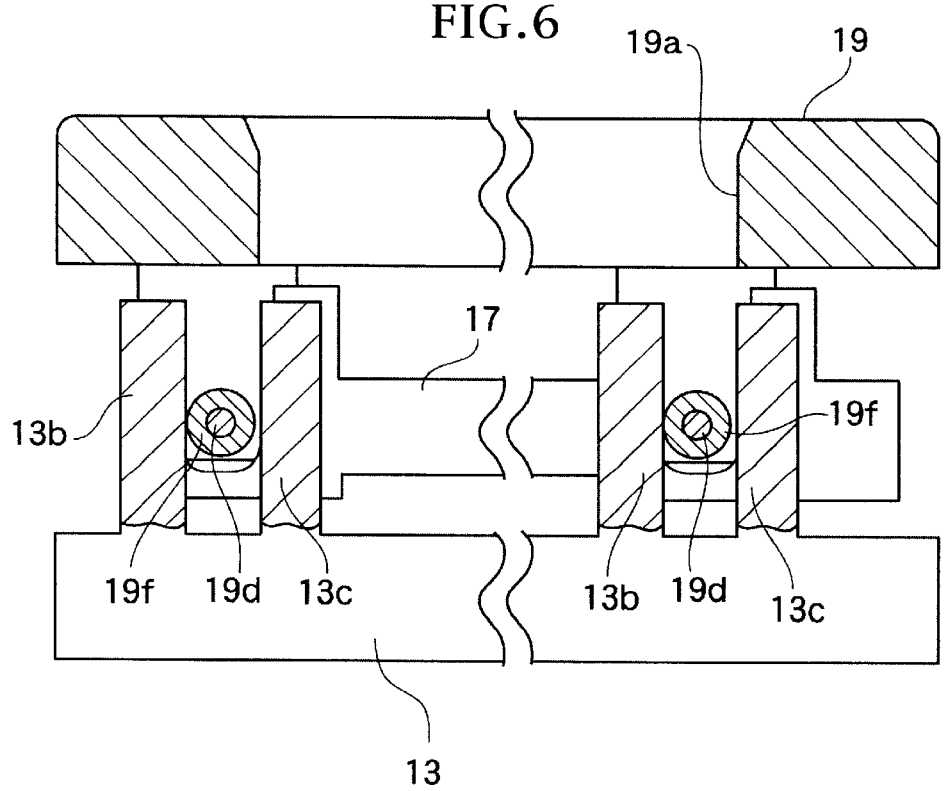
FIG. 6 is a schematic sectional view taken along the line VI—VI in FIG. 1.

FIGS. 6 and 8 show that the socket body 13 is formed, in an upward projecting manner, with a rolling wall section 13b on which the roller 19f for reaction rolls so that a reaction force acting to the operation member 19 at the time when the slide plate 17 is moved is received by the rolling wall section 13b through the reaction roller 19f. The reaction roller 19f and the rolling wall section 13b constitute, in combination, a reaction receiving means. The socket body 13 is further formed with a guide wall section 13c adjacent to the rolling wall section 13b so as to extend in parallel thereto, and the reaction roller 19f is disposed between these wall sections 13b and 13c to thereby guide the vertical motion of the operation member 19.

The present invention of the structure mentioned above will operate or function as follows. First, when it is required to set a number of integrated circuit sockets 11 preliminarily disposed on the printed circuit board to the integrated circuit packages 12, respectively, the operation member 19 is depressed downward. At this time, the operation member 19 is lowered, with high performance, vertically downward with respect to the mount portion 18*a* of the top plate 18 in a state that the reaction roller 19*f* is inserted between and guided by the guide wall section 13*c* and the rolling wall section 13*b* of the socket body 13.

Figure 5:
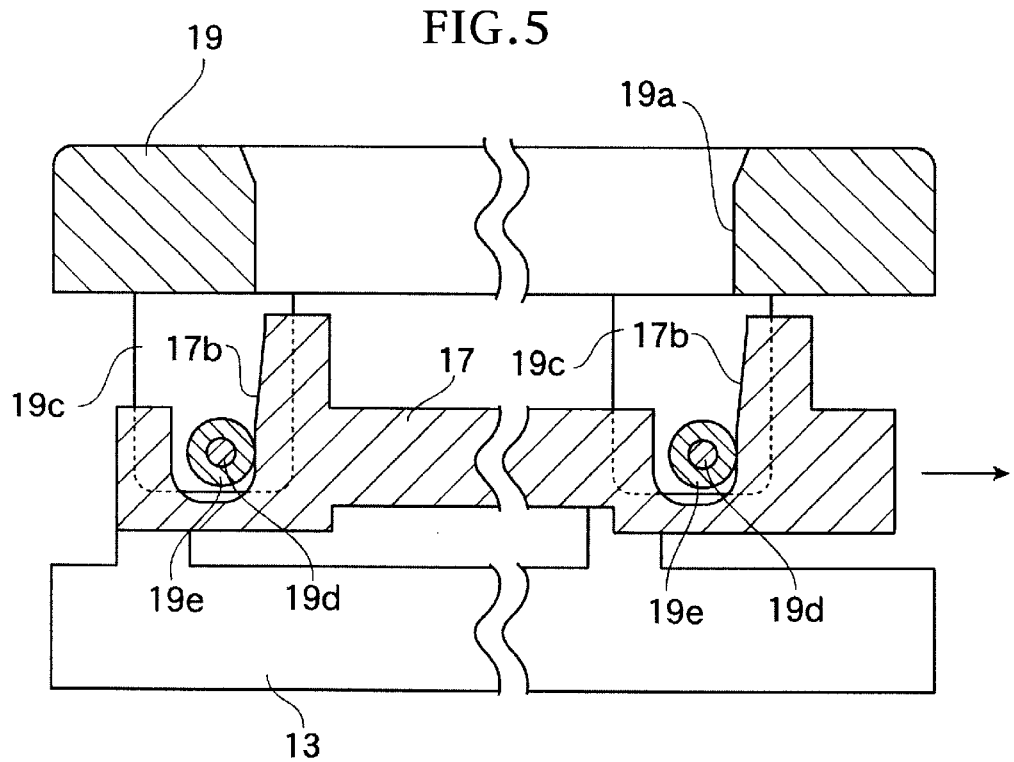
FIG. 5 is a schematic sectional view taken along the line V—V in FIG. 1.

Accordingly the lowering motion of the operation member 19, causes the movement roller 19*e* to roll on the inclined surface portion 17*b* of the slide plate 17, and hence, the slide plate 17 is slid in the direction of the arrow in FIG. 5. Then, the movable side elastic piece 15*i* of the contact pin 15 is pressed and then elastically deformed, by the pressing portion 17*a* of the slide plate 17. On the other hand, the stationary side elastic piece 15*h* is held to a predetermined position by the positioning portion 18*c* of the top plate 18.

According to the above operation, the paired contact portions 15*d* of the contact pin 15 are opened as shown in FIG. 10H.

Further, during the above operation, the press portion 38*c* to be pressed on the latch 38 is pressed by the operation protrusion 19*b* of the operation member 19 and rotated in a counterclockwise direction. In FIG. 2, the operation member works against the urging force of the spring 39, the pressing portion 38*b* of the latch 38 is deformed to the retired position.

Under the state mentioned above, the integrated circuit packages 12 conveyed by the automatic machine are mounted on the mount portion 18*a* of the top plate 18 to the predetermined positions under the guidance of the guide portions 18*b* and the solder balls 12*b* of the integrated circuit packages 12 are inserted between the opened contact portions 15*d* of the contact pins 15, respectively, with non-contact state.

Thereafter, when the downward force to the operation member 19 is released, the operation member 19 is moved upward by the urging force of the spring. At the same time, the slide plate 17 is slid to the original position by the urging force of the movable side elastic piece 15*i* of the contact pin 15. The latches 38 are also rotated in the clockwise direction in FIG. 2 by the urging force of the spring 39.

Figure 10C:
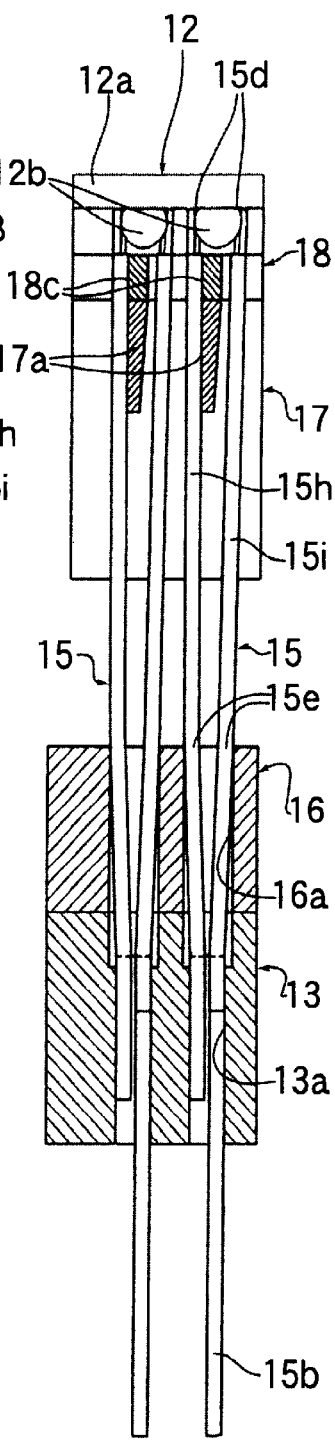
Figure 11:
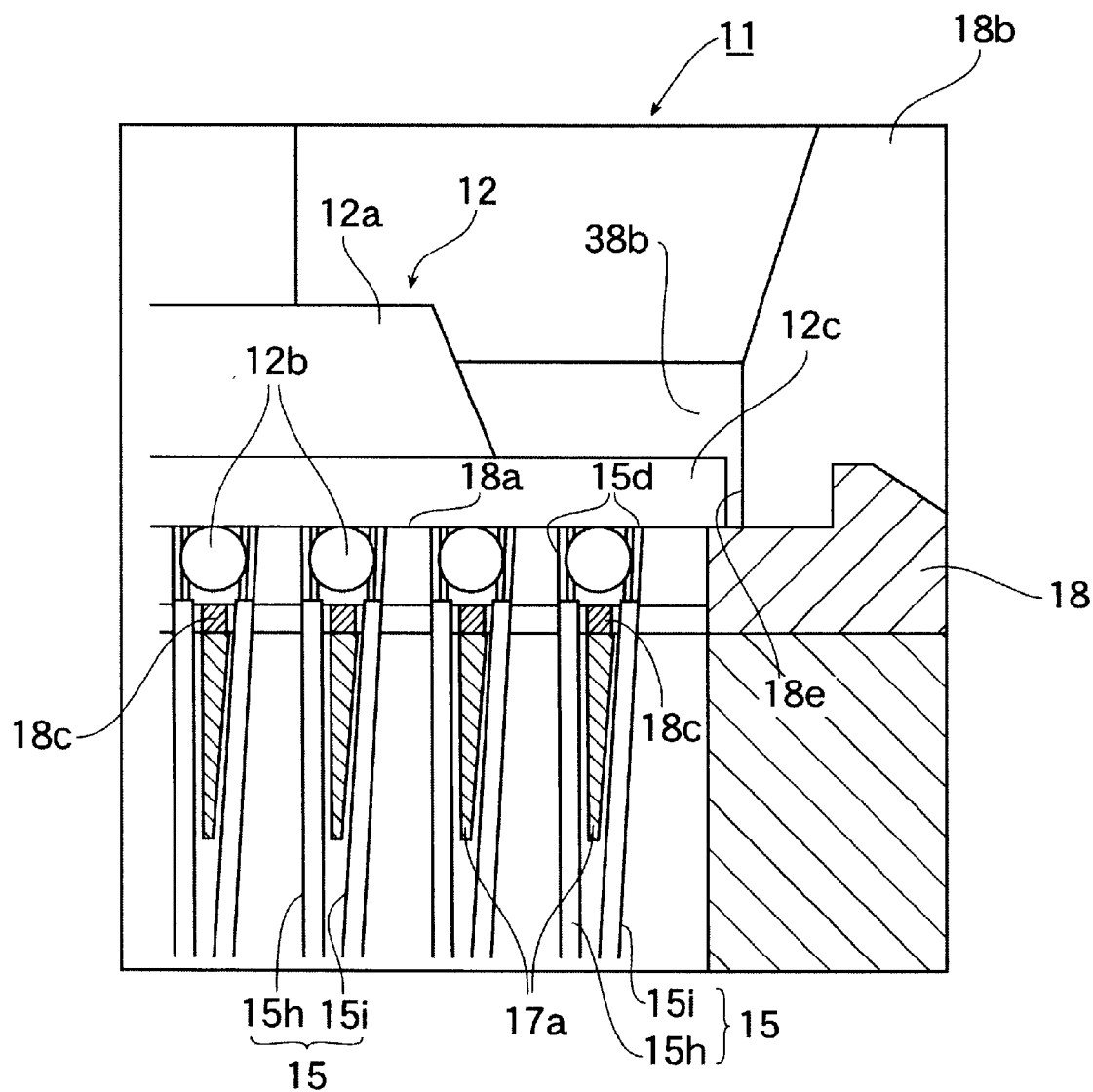
FIG. 11 is a sectional view showing a state that the solder balls are clamped between the paired contact portions of the contact pins, respectively.

When the slide plate 17 is slid in the leftward direction as viewed in FIG. 10C, the pressing force to the movable side elastic piece 15*i* of the contact pin 15 is released and the elastic piece 15*i* is returned to the original position, whereby the solder ball 12*b* is clamped between the contact portion 15*d* of this movable side elastic piece 15*i* and the contact portion 15*d* of the stationary side elastic piece 15*h* as shown in FIG. 10C or FIG. 11. In the clamped state, the stationary side elastic piece 15*h* is also slightly elastically deformed so that the contact portion 15*d* of this stationary side elastic piece 15*h* is slightly deformed in a direction to be widened.

According to the motions and operations described above, the solder balls 12*b* of the integrated circuit packages 12 and the printed circuit board is electrically connected through the contact pins 15.

Accordingly, as mentioned above, the integrated circuit packages 12 can be held by the integrated circuit sockets 11, and a printed circuit board on which such integrated circuit sockets 11 are set will be a burn-in tested by being located in a burn-in vessel, for example.

Figure 12:
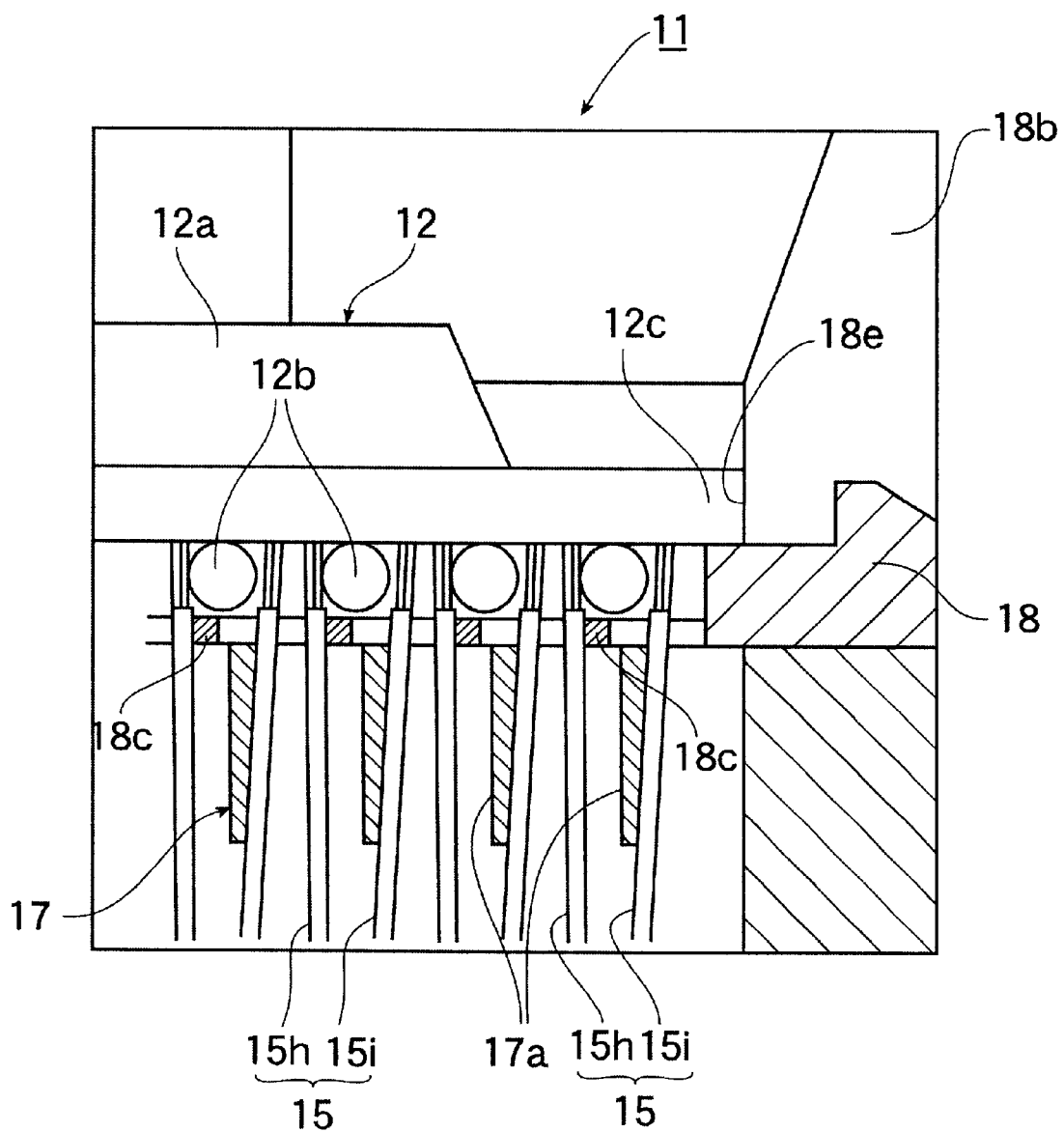
FIG. 12 is a sectional view, corresponding to FIG. 11, showing a state that the paired contact portions of the contact pins are opened, respectively.

In the next process, when the integrated circuit packages 12 are removed from the mounted state, the operation member 19 is lowered in a manner mentioned above. Then, the slide plate 17 is slid rightwardly from the state shown in FIG. 11, the movable side elastic piece 15*i* is elastically deformed in the right direction as shown in FIG. 12, and the contact portion 15*d* of this movable side elastic piece 15*i* is deformed. According to this manner, the paired contact portions 15*d* are separated from the solder ball 12*b* of the integrated circuit package 12 and the integrated circuit package 12 is then removed from the integrated circuit socket 11 by the automatic machine with no drawing force on the solder balls 12*b*.

This structure, where the slide plate 17 is slid by utilizing the movement roller 19*e* and the inclined surface portion 17*b*, can eliminate the use of a link mechanism as in the prior art, and accordingly, the number of parts or members to be used can be reduced. Further, it is not necessary to secure a space in which a plurality of link members each having a long scale are located. Thus, the entire structure can be made simple and compact.

Furthermore, the use of the movement roller 19*e* can effectively prevent the wearing of the inclined surface portion 17*b*, thus extending the usable lifetime.

In the present invention, the moving direction of the slide plate 17 is on the diagonal line of a rectangular outer shape of the integrated circuit socket 11, and accordingly, if the link members are disposed in parallel to the diagonal line, the entire structure of the device is made large. This defect can be eliminated by arranging the movement roller 19*e* and the inclined surface portion 17*b* on the diagonal line so that the slide plate 17 can be slid in this direction as in the present invention, effectively making the structure smaller.

When the movement roller 19*e* presses the inclined surface portion 17*b*, a reaction force is applied from the inclined surface portion 17*b* to the movement roller 19*e*. For this reason, the operation member 19 may operate to move horizontally. However, this motion can be prevented by the rolling motion of the reaction roller 19*f* on the rolling wall section 13*b* of the socket body 13, and accordingly, the operation member 19 can be precisely vertically moved. Moreover, in this operation since the reaction roller 19*f* rolls on the inclined surface portion 17*b*, the wearing can be effectively reduced. Further, in this case, the reaction rollers 19*f* and the movement roller 19*e* roll in directions reverse to each other.

Since the movement roller 19*e* and the reaction rollers 19*f* are mounted on the same shaft 19*d*, the structure can be made compact, and the reaction force acting from the inclined surface portion 17*b* to the movement roller 19*e* is received by the rolling wall section 13*b* through the reaction rollers 19*f* mounted on the shaft 19*d* coaxially with the movement roller 19*e*. Therefore, the portion from which the reaction force is generated and a portion to which the reaction force is received have a short distance between them. Thus, an unnecessary external force is not widely applied to the operation member 19, whereby the operation member 19 can be moved smoothly.

Further, it is to be noted that the present invention is not limited to the embodiment described above and many other changes and modifications may be made without departing from the scopes of the appended claims.

For example, although in the embodiment described, the present invention is applied to the integrated circuit socket 11 as "socket for electrical parts", the present invention is of course applicable to other devices. Moreover, in the described embodiment, although the roller 19*e* for movement is formed to the operation member 19 and the inclined surface portion 17*b* is formed to the slide plate 17, in an alternation, it may be possible to form the inclined surface portion to the operation member and the movement roller to the slide plate. Furthermore, although the rollers 19f for reaction are formed to the operation member 19 and the rolling wall section 13b is formed to the socket body 13, in an alternation, the reaction rollers may be formed to the socket body and the rolling wall section may be formed to the operation member. Still furthermore, although the reaction force receiving means utilizes the reaction rollers 19f rolling on the rolling wall section 13b, this structure may be constituted without using any roller. Still furthermore, although in the described embodiment, the contact pin is formed with movable and stationary side elastic pieces, a contact pin formed only with the movable side elastic piece may be adopted.

What is claimed is:

1. A socket for an electrical part, the socket comprising:
   a socket body with a surface and a mount portion in which an electrical part having a plurality of terminals is mounted;
   a plurality of contact pins mounted on the socket body that are elastically contacted to or separated from the plurality of terminals of the electrical part, the plurality of contact pins having an elastic piece formed at a front end, with a contact portion;
   a single slide plate slidably connected on a surface of the socket body; and
   an operation member that is vertically movable with respect to the surface of the socket body, wherein either the operation member or the slide plate is formed with an inclined surface and the other of the operation member and the slide plate is formed with a movement roller member which rolls on the inclined surface portion such that when the operation member is moved in a direction normal to the surface of the socket body, the roller member rolls on the inclined surface portion to thereby slide the slide plate in one direction against an elastic force of the plurality of contact pins.

2. A socket for an electrical part according to claim 1, wherein a reaction receiver receives a reaction force applied from the operation member to the socket body when the slide plate is moved between the operation member and the socket body.

3. A socket for an electrical part according to claim 2, wherein the reaction receiver comprises a reaction roller member, for either the operation member or the socket body and a rolling wall, on which the reaction roller member rolls, formed to the other of the socket body and the operation member so that the reaction force acting on the operation member when moving the slide plate is received by the socket body through the reaction roller member and the rolling wall.

4. A socket for an electrical part according to claim 3, wherein the socket body is formed with a guide wall section having an interval from the rolling wall between which the reaction roller is inserted to thereby constitute a guide for the operation member.

5. A socket for an electrical part according to claim 3, wherein the inclined surface is formed on the slide plate and the movement roller member and the reaction roller member are mounted on a common axial member and the rolling wall section is formed to the socket body.

6. A socket for an electrical part according to claim 1, wherein the socket body has a rectangular outer shape, the slide plate is slidable on a generally diagonal line across the rectangular shape, and the roller member and the inclined surface are disposed on the diagonal line.

7. A socket for an electrical part according to claim 1, wherein the operation member is provided with a plurality of support posts which are disposed at each portion of a diagonal line thereof, a support shaft disposed between the plurality of support posts, movement roller member is mounted at a central portion of the support shaft, and the reaction roller members are mounted on a side portion of the movement roller member on the support shaft.

8. A socket for an electrical part, the socket comprising:
   a socket body with a mount portion on which an electrical part having a plurality of terminals is mounted;
   a plurality of contact pins mounted on the socket body that are elastically contacted to or separated from the plurality of terminals of the electrical part, the plurality of contacts pin having an elastic piece formed at a front end, with a contact portion, which is displaced in accordance with an elastic deformation of the elastic piece;
   a single slide plate slidably connected to a surface of the socket body;
   an operation member that is vertically movable with respect to the surface of the socket body; and
   a reaction receiver that receives a reaction force applied from the operation member to the socket body at a time when the slide plate is moved between the operation member and the socket body,
   the reaction receiver comprising a reaction roller member, for either the operation member or the socket body and a rolling wall, on which the reaction roller member rolls, formed to the other of the socket body and the operation member so that the reaction force acting on the operation member when moving the slide plate is received by the socket body through the reaction roller member and the rolling wall.

9. A socket for an electrical part according to claim 8, wherein either the operation member or the slide plate is formed with an inclined surface and the other of the operation member and the slide plate is formed with a movement roller member which rolls on the inclined surface portion such that when the operation member is moved in a direction normal to the surface of the socket body, the roller member rolls on the inclined surface portion to thereby slide the slide plate in one direction against an elastic force of the plurality of contact pins.

10. A socket comprising:
    a socket body with a mount portion in which a part having at least one terminal is mounted;
    a slide plate that slides in a first direction to contact the at least one terminal;
    an operation member that is movable in a second direction;
    an inclined surface on either the operation member or the slide plate; and
    a movement roller member connected to the other of the operation member and the slide plate, wherein when the operation member is moved in the second direction, the movement roller member rolls on the inclined surface portion to thereby slide the slide plate in the first direction.

11. The socket of claim 10, further comprising at least one contact pin, mounted on the socket body, that elastically deforms to contact the at least one terminal when the slide plate slides in the first direction.

12. The socket of claim 10, wherein the first direction is diagonal across the socket body.

13. The socket of claim 10, wherein the second direction is toward or away from the socket body.

14. The socket of claim 10, further comprising a reaction receiver that receives a reaction force applied to the operation member when the slide plate is slid in the first direction.

15. The socket of claim 14, wherein the reaction receiver further comprises:

a reaction roller member; and a reaction receiver surface on which the reaction roller member rolls.

* * * * *

UNITED STATES PATENT AND TRADEMARK OFFICE
CERTIFICATE OF CORRECTION

PATENT NO. : 6,296,504 B1  
DATED : October 2, 2001  
INVENTOR(S) : Yoshiyuki Ohashi Page 1 of 1

It is certified that error appears in the above-identified patent and that said Letters Patent is hereby corrected as shown below:

<u>Title page,</u>  
Item [73], Assignee, change "Enples" to -- Enplas --.

Signed and Sealed this

Fourteenth Day of May, 2002

*Attest:*

*Attesting Officer*

JAMES E. ROGAN  
*Director of the United States Patent and Trademark Office*